United States Patent [19]

Economy et al.

[11] Patent Number: 5,707,782

[45] Date of Patent: Jan. 13, 1998

US005707782A

[54] PHOTOIMAGEABLE, DIELECTRIC, CROSSLINKABLE COPOLYESTERS

[75] Inventors: James Economy; Lizabeth A. Schneggenburger; Fang Shi, all of Urbana, Ill.

[73] Assignee: The Board of Trustees of the University of Illinois, Urbana, Ill.

[21] Appl. No.: 609,465

[22] Filed: Mar. 1, 1996

[51] Int. Cl.$^6$ ...................................... G03F 7/027
[52] U.S. Cl. ............................ 430/285.1; 430/287.1; 430/286.1; 522/104; 522/105; 522/107; 525/450; 525/442
[58] Field of Search .................... 430/285.1, 287.1, 430/286.1; 522/104, 105, 107; 525/450, 442

[56] References Cited

U.S. PATENT DOCUMENTS

| | | | |
|---|---|---|---|
| 3,858,510 | 1/1975 | Kai et al. | 430/285.1 X |
| 4,108,844 | 8/1978 | Kawai | 430/285.1 X |
| 4,435,496 | 3/1984 | Walls et al. | 430/285.1 |
| 4,564,575 | 1/1986 | Perreault et al. | 430/165 |
| 4,743,663 | 5/1988 | Jones et al. | 430/285.1 |
| 4,837,126 | 6/1989 | Lin | 430/285.1 X |
| 4,925,773 | 5/1990 | Miyamura et al. | 430/285.1 |
| 4,970,135 | 11/1990 | Kushi et al. | 430/285.1 X |
| 5,182,184 | 1/1993 | Lazarus et al. | 430/165 |
| 5,439,541 | 8/1995 | Economy | 156/182 |

FOREIGN PATENT DOCUMENTS

| | | | |
|---|---|---|---|
| 54-58792 | 5/1979 | Japan | 430/285.1 |

OTHER PUBLICATIONS

R. Rubner et al., Phot. Sci. & Eng. 23 (5), 303–309 (1979).
L. Schneggenburger & J. Economy, MCM Proceedings, 65 (1995).

*Primary Examiner*—Cynthia Hamilton
*Attorney, Agent, or Firm*—George W. Rauchfuss, Jr.

[57] ABSTRACT

Photosensitive, dielectric insulating, crosslinkable copolyester films used as dielectric and as photoresist films for microelectronics circuits which are also suitable for use in producing MCM-L packages. In various embodiments of the invention there is provided photosensitive, dielectric insulating, crosslinkable copolyester film forming mixtures for coating onto microelectronics substrate surfaces, a photosensitive oligomer for producing the crosslinkable copolyesters and MCM-L products produced using the crosslinked copolyesters.

6 Claims, No Drawings

PHOTOIMAGEABLE, DIELECTRIC, CROSSLINKABLE COPOLYESTERS

FIELD OF THE INVENTION

This invention relates to photoimageable, crosslinked copolyester dielectrics for use as photoresist films on microelectronics chips substrates and for use as substrates for producing microelectronics packages such as multiple chip module laminates.

BACKGROUND OF THE INVENTION

In the conventional fabrication of a microelectronics chip there are a large number of steps involved, including among others, for example, coating an adhesion promoter on a chip surface and baking same, coating and baking a dielectric insulating layer thereon, coating and pre-baking a photoresist film thereon, exposing and then developing the photoresist film, etching the pattern, removing the photoresist and curing of the patterned circuit. In addition to the need for making the fabrication of chips more reliable, it is highly desirable that as many fabrication steps as possible be either eliminated or combined.

It has been proposed by R. Rubner et al. in Phot. Sci. & Eng. 23(5) 303-309 (1979) to introduce photosensitive groups into polyimides for use as dielectric resists. However, such photosensitive polyimide systems as proposed by Rubner et al. have a number of significant disadvantages, including and not limited to, low photosensitivity, high volume shrinkage of about 60%, relative high cost of polyimides, dielectric constants that are relatively high, high curing temperature, the need for vacuum venting of volatiles, poor adhesion, and high moisture absorption. Therefore, it would be desirable to provide a photosensitive film forming polymer that addresses one or more of the foregoing drawbacks of the photosensitized polyimides of R. Rubner et al. and which allows for the elimination of a significant number of fabrication steps in the production of microelectronics chips.

Additionally, the development of multiple chip module laminates (MCM-L) has required significant improvement in the products relating to glass transition temperature, dielectric constant, resistivity, moisture resistance, thermal conductivity and coefficient of thermal expansion. It is becoming increasingly clear that neither epoxy/glass nor polyimide/glass systems will be able to meet the requirements in the future development of MCM-L. Thus, there is also a need for a further system suitable for use in MCM-L applications which addresses these needs.

BRIEF DESCRIPTION OF THE INVENTION

In accordance with this invention, there is provided photosensitive, dielectric insulating, crosslinkable copolyester films used as dielectric and as photoresist films for microelectronics circuits which are also suitable for use in producing MCM-L packages and flexible configurable systems. In various embodiments of the invention there is provided photosensitive, dielectric insulating, crosslinkable copolyester film forming mixtures for coating onto microelectronics substrate surfaces, a photosensitive oligomer for producing said crosslinkable copolyesters and MCM-L products produced using said crosslinked copolyesters. Of particular advantage is the capability of these crosslinked copolyesters to form a good adhesive bond to another crosslinked coating by heating in the solid state.

DETAILED DESCRIPTION OF THE INVENTION

In order to make the photosensitive, dielectric insulating, crosslinkable copolyesters of this invention there is to be provided two oligomers, one of said oligomers having carboxylic acid end groups and the other of said oligomers having acyloxy, preferably acetoxy, end groups and where at least one of said oligomers is branched and also where one of said two oligomers has photolithographically sensitive groups present in the oligomer structure, preferably as end groups, to form a crosslinkable mixture of said oligomers.

As used in this invention, the term "oligomer" shall mean a low molecular weight polymer having about 3 to about 25 monomer units. Although the molecular weight of the oligomers may vary over a wide range, it is preferred that the molecular weight be less than about 850 and preferably in the range of from about 700 to 850.

Although either of the crosslinkable oligomers may have the photolithographically sensitive groups present in the oligomer, it is preferred that the photolithographically sensitive groups be present in the oligomer containing the carboxylic acid end groups.

One of the oligomers has carboxylic acid end groups and the other acyloxy end groups. Although the crosslinkable mixture may comprise two oligomers, it is to be recognized that crosslinkable mixture may comprise more than two oligomers and may have one or more oligomers with carboxylic acid end groups and one or more oligomers having acyloxy end groups. The acyloxy end group is selected so that any free acid that is formed during the crosslinking and transesterification is volatile and is released from the mixture. As examples of such acyloxy groups there can be mentioned $CH_3CO_2-$, $C_2H_5CO_2-$, $C_6H_5CO_2-$, $CH_3OCO_2-$ and the like. However, the acyloxy end group is preferably an acetoxy end group, namely $CH_3CO_2-$, so that the volatile acid released is acetic acid. As used in this invention "carboxylic acid end groups" shall include end groups which, at the curing or crosslinking temperatures employed, decompose to provide a carboxylic acid end group.

One of the oligomers must be branched. That is, one of the oligomers must have more than two of the functional end groups, i.e. more than two of the carboxylic acid or more than two of the acyloxy end groups. Either the oligomer containing carboxylic acid end groups may contain three or more carboxylic acid end groups or the oligomer containing acyloxy end group may contain three or more acyloxy end groups.

The oligomers may be homopolymers. Alternatively, the oligomers may be copolymers, for example, branched, graft, linear, random, alternating or block copolymers. In addition, if the oligomer has stereocenters, the stereocenters may have the same absolute configuration, a random configuration, an alternating configuration or any other variation thereof. Monomers from which the above oligomers may be made include, but are not limited to, 4-hydroxybenzoic acid, 2-hydroxy-6-naphthoic acid, hydroquinone, isophthalic acid, terephthalic acid, 4,4'-biphenol, trimesic acid, trimellitic acid, adipic acid, ethylene glycol, hydroquinone diacetate, 4-acetoxybenzoic acid, 2-acetoxy-6-naphthoic acid and 4,4'-diacetoxybiphenol.

One of the oligomers will also have in its structure photolithographically sensitive groups such that the resulting crosslinkable film is photosensitive and renders the film-forming mixture suitable for use in producing a photoresist film for use in photolithography applications. The oligomers could have any suitable photosensitive group incorporated in their structure so as to render them photosensitive to UV, X-ray and electron beam photolithography or the like. As examples of photosensitive groups that might be incorporated into the oligomer structure, there may be mentioned, allylic groups, particularly acrylic and methacrylic groups, diazo groups such as diazonaphthoquinone sulfonates and diazo- Meldrum's acid, onium salt groups and the like. However, it is preferred that the photosensitive groups be the allylic group containing a methacryl group, particularly the group

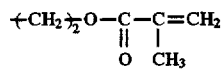

derived from 2-hydroxyethyl methacrylate.

Incorporation of the photosensitive group into the oligomer will be accomplished by any synthesis process suitable to the particular oligomer and the particular photosensitive group to be incorporated therein. It is most preferred that the

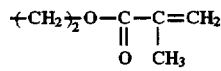

be incorporated as end groups in an oligomer containing the carboxylic acid end groups by the reaction of the oligomer containing the carboxylic acid end groups with 2-hydroxyethyl methacrylate. It is to be understood that the amount of 2-hydroxyethyl methacrylate employed can be varied to react with some or all the carboxylic acid end groups in the oligomer. It should be apparent that the photoreactive group can degrade at elevated temperatures to reform the carboxylic acid end groups essential for crosslinking with the acyloxy end group containing oligomer.

It will be understood that in accordance with this invention one of the two oligomers required for the production of a photosensitive, dielectric insulating, crosslinkable copolyester film will be a first oligomer for reacting with a second oligomer in which said first oligomer comprising an oligomer having photolithographically sensitive groups present in the oligomer and wherein said first oligomer has carboxylic acid end groups when said second oligomer has acyloxy end groups and said oligomer has acyloxy end groups when said second oligomer has carboxylic acid end groups, with the proviso that said oligomer is branched if said second oligomer is not branched.

The photosensitive oligomers of this invention are stable for months if stored in the dark at room temperature and are highly soluble in polar solvents, such as tetrahydrofuran, dimethyl formamide, N-methylpyrrolidone and the like.

Once the necessary oligomers have been prepared, one can prepare a photosensitive, dielectric insulating, crosslinkable copolyester film-forming mixture comprising:

(a) at least one oligomer having carboxylic acid end groups, and (b) at least one oligomer having acyloxy end groups in a film-forming solvent for said oligomers, and wherein at least one of said oligomers has photolithographically sensitive groups present in the oligomer and one of the oligomers is branched.

It will be understood that the film-forming mixture may have other non-interfering additives present, such as photosensitive agents, such as Michler's ketone or the like.

The invention also includes a method for producing a photosensitive, dielectric insulating, crosslinked copolyester film on a microelectronics chip having a substrate surface comprising the steps of:

(a) combining, in a film forming solvent, at least one oligomer having carboxylic acid end groups with at least one oligomer having acyloxy end groups, wherein one of the oligomers has photolithographically sensitive groups present in the oligomer and one of the oligomers is branched, to form a photosensitive, crosslinkable film forming mixture;

(b) coating, such as by spin or dip coating, said mixture onto the substrate surface to form a photosensitive, crosslinkable film on said substrate surface;

(c) photolithographically patterning said film and developing the resulting pattern; and (d) crosslinking the patterned film on the substrate surface by heating said patterned film to a temperature sufficient to break down the photochemically crosslinked structure followed or accompanied by curing of the acyloxy/carboxylic acid end groups. Typically, the photochemically crosslinked structure will break down with evolution of ethylene and acrylate moieties or their degradation products.

The time and temperature for curing may be selected by those skilled in the art using no more than trial and error. The exact curing time and temperature for a particular oligomer mixture will depend on the composition of the mixture. For example, a mixture comprising oligomers made from aromatic monomers may require a higher curing temperature than a mixture of oligomers made from part aromatic monomers and part aliphatic monomers. Similarly, a mixture comprising aliphatic oligomers will typically require a lower curing temperature than a mixture composed of either all aromatic oligomers or a mixture of aromatic and aliphatic oligomers. Generally, in the curing process, the different oligomers undergo further polymerization to higher molecular weight polymers and then crosslinking occurs. Part of the curing process may also be considered to be an interchain transesterification reaction. After curing, the mixture is a solid crosslinked copolyester. Curing will generally take place at a temperature within the range of from about 180° C. to about 325° C., preferably from about 180° C. to about 280° C. over a period of up to about 2 hours. Under certain conditions, crosslinking occurs with the release of volatile fragments resulting in the crosslinked polyester being permanently foamed.

A further embodiment of the invention relates to the use of the photosensitive, dielectric insulating, crosslinked copolyesters for producing multiple chip module laminates by producing a plurality of microelectronic circuits, such as power distribution circuits, ground line circuits, redistribution circuitry and the like, on liquid crystalline polyester substrates and using the photosensitive oligomeric film forming mixtures in the manner previously described and then stacking two or more of said laminates on top of one another and subjecting said stacked laminates to sufficient heat and pressure to cause said laminates to be bonded together as a multiple laminate by intermolecular ester interchange transesterification at interfaces of the crosslinked copolyester films of this invention and the liquid crystalline polyester substrates. Also, it will be apparent to those skilled in the art that the photosensitive, crosslinkable copolyesters of this invention may be used in configuring flexible substrate systems.

The photosensitive, dielectric insulating, crosslinked copolyester films produced in accordance with this invention are characterized by having dielectric constants of 4.75 to 2.5 or less at 25° C. and 1 MHz, possessing good dimensional stability, having use temperatures up to as high as 350° to 400° C., having low moisture absorption of about 0.4% and high chemical resistance, crosslinked foams stable to about 400° C. for production of MCM-L, having good photosensitivity, producing good resolution, and having good mechanical properties including negligible shrinkage, generally less than 0.1 µm for 3 µm thick patterns. Moreover, the monomers for producing these products are generally low cost starting materials of about $6/pound or less.

It will be appreciated from a reading of the following Examples that this invention enables one to eliminate the step of etching the polyester and also eliminates the coating and removal of photoresist films separate from the dielectric film in the chip production process.

This invention is exemplified, but not limited, by the illustrative examples.

EXAMPLES

Example 1: Photoimageable Crosslinkable Aromatic Oligomers

An aromatic oligomer was prepared by reacting 16.8 g trimesic acid (TMA), 21.6 g acetoxy benzoic acid (ABA) and 7.76 g hydroquinone diacetate (HQDA) in the presence of in 29.11 g pyridine in a flask equipped with a reflux condenser and heated to 230° C. for 15 minute under an $N_2$ purge. The heat was raised to 260° C. and after 30 minutes, an additional 12.15 g pyridine added until the solution cleared. Approximately 34.65 g acetic acid and pyridine distillate (T=130° C.) was taken off and after 1 hour the temperature was raised to 280° C. After three hours the heating and nitrogen flow was stopped and vacuum applied. There was collected 62.31 g comprising about 12 g acetic acid and 50.31 g pyridine. The reaction product was purified by mixing with 10% acetic acid and distilled water with stirring, then filtered, rinsed twice with water, filtered again and dried in a drying oven at 50° C. Approximately 26.3 g light yellow powder product, isotropic oligomer having a m.p. of 142° C., resulted.

About 6 g of the oligomer was dissolved in 120 ml tetrahydrofuran (THF) and reacted with 15 ml thionyl chloride by refluxing the reaction mixture at 90° C. for 12 hours. The thionyl chloride and THF were then vacuum evaporated to produce a powdered oligomer having acyl chloride end groups which was then dissolved in 120 ml THF and 15 ml 2-hydroxyethyl methacrylate added thereto along with 15 ml triethylamine catalyst and allowed to react at room temperature for about 8 hours. Thereafter, the reaction solution was added to 50 to 60x room temperature water and the oligomeric product deposited. The solution was vacuum filtered to yield 3.6 g light yellow photosensitive oligomeric powder (Component A) having both photosensitive

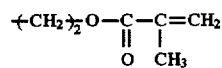

and a relatively small concentration of carboxylic acid end groups present in the oligomer.

An aromatic oligomer (Component B), of the formula:

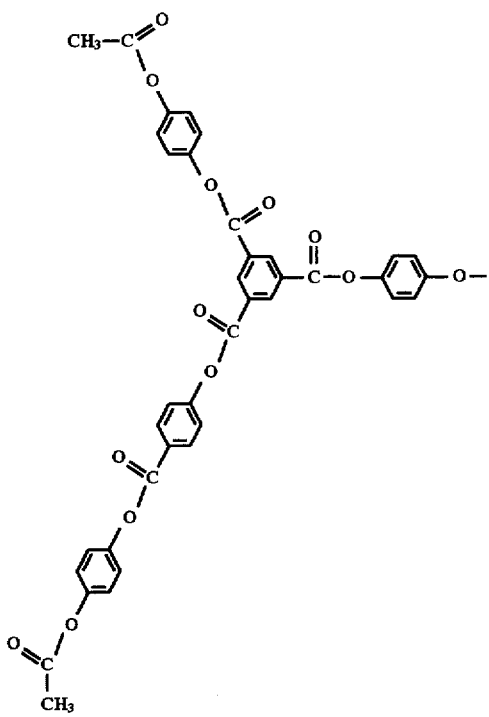

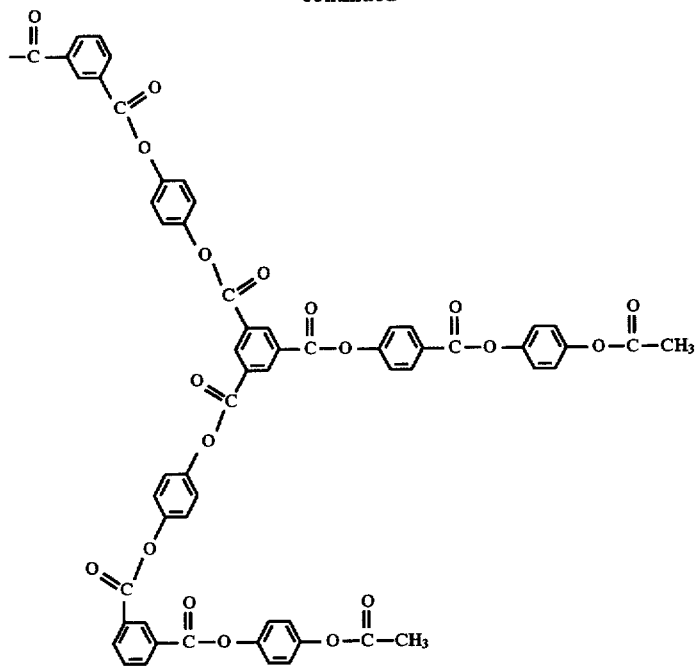

and suitable for subsequent cross-linking with Component A, was prepared by reacting 22.4 g TMA, 19.2 g ABA, 72.4 g HQDA and 17.72 g isophthalic acid (IPA) under a nitrogen atmosphere in a flask equipped with a reflux condenser heated to 230° C. for 10 minutes. After 30 minutes acetic acid began to come off as a 150° C. distillate. After two hours the reaction was stopped and 38 ml acetic acid was collected. The reaction product was then worked up by filtering, rinsing with 50 to 60x water, filtering again and drying in a drying oven at 150° C. to yield 89.3 g of oligomeric Component B having a m.p. of 165° C.

A solution of 2 g photosensitive oligomeric Component A and 0.6 g oligomeric Component B was dissolved in 10 ml THF, was spin-coated onto a silicon wafer using a Headway Model EC 101 photoresist spinner under air (50–60% humidity) and solvent vapor saturated atmosphere at a spin speed of 2000 rpm for 20 seconds to provide a film thickness on the wafer of about 8 μm measured using a DEKTAK 3030 Auto Surface Profilometer. The film was pre-baked in a vacuum oven at 90° C. for 15 minutes. The photosensitive film was then photo-patterned using a Karl Süss MJB3 Mask Aligner in an air conditioned room at about 25° C., relative humidity of about 48% and in yellow light to exclude light with a wavelength of >500 nm. Intensity on the exposed surface was 15.5 nW/cm² at a wavelength of 365 nm for about 270 seconds. The exposed film was developed with acetone for 20 seconds.

In a second test, 2.7 weight percent Michler's ketone photosensitizer was added to a 20 wt. % solution of the aromatic oligomer mixture in THF. The solution was then similarly spin-coated on a silicon wafer pretreated with hexamethyldisilizane (HMDS). The spin-coating was conducted under air (50–60% humidity) and a solvent vapor saturated atmosphere at a spin speed of 2000 rpm for 20 seconds to provide a film thickness of about 6 microns. The film was pre-baked in a vacuum oven for 15 minutes. The photosensitive film was then photo-patterned using a Karl S üss MJB3 Mask Aligner in an air conditioned room at about 25° C., relative humidity about 48% and in yellow light to exclude light with a wavelength of >500 nm. Intensity on the exposed surface was 15.5 nW/cm₂ at a wavelength of 365 nm for 240 seconds. The exposed film was developed with acetone for 20 seconds.

In both tests the film patterns were characterized using a Zeiss DSM 960 scanning Electron Microscope. In both tests excellent resolution of 18 μm was obtained as were excellent patterned lines of a width of about 50 μm.

Example 2: Photoimageable Crosslinkable Aromatic Aliphatic Oligomers

In a reaction flask equipped with a reflux condenser 12.2 g terephthaloyl chloride and 3.6 g (3.54 ml) butanediol were dissolved in 60 ml THF and heated at reflux at 100° C. for about six hours and thereafter cooled to about 50° C. To this reaction product 5.2 ml of 2-hydroxyethyl methacrylate was added and allowed to react for about 10 hours. About 50 to 60x water was added, the mixture vacuum filtered to yield 7 g white powdered photosensitive oligomer (Component C) having photosensitive

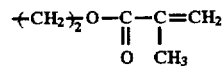

reacted by esterification with the carboxylic acid end groups present in the oligomer.

A copolymerizable crosslinkable resin (Component D) suitable for subsequent crosslinking with photosensitive Component C was prepared in the following manner. One mol of GP 2037 RESIN-FLAKE® phenol-formaldehyde novolac resin (available from Georgia-Pacific Corp.) was modified by reacting with 3 mols acetic anhydride in 50 ml of 15% NaOH solution at room temperature for about 2 hours to produce Component D, a modified novolac resin of the formula:

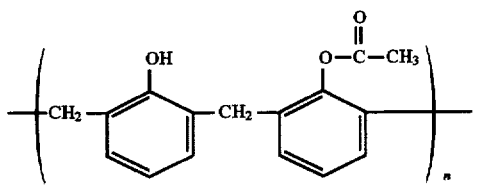

Two grams of a mixture of 7 g photosensitive Component C and 2 g Component D in 10 ml THF was prepared and spin-coated at 2000 rpm for 20 seconds onto a HMDS-treated silicon nitride wafer in the same manner as described in Example 1 to provide a film thickness on the wafer of about 26 μm. After the film was pre-baked at 90° C. for about 15 minutes, the film was imagewise exposed at 365 nm for 240 seconds and acetone developed as described in Example 1. When 0.02 g Michler's ketone sensitizer was added to the film forming solution, exposure time was reduced to about 60 seconds. In both tests the film pattern was characterized using the Zeiss DS 960 Scanning Electron Microscope. In both tests excellent resolution at 16 μm was obtained as were excellent patterned lines of a width of 6 μm.

Example 3: Photoimageable Crosslinkable Aromatic-Aliphatic Oligomers

In a reaction flask equipped with a reflux condenser 10.62 g of 1,3,5-benzene tricarbonyl trichloride and 2.7 g butanediol dissolved in 80 ml THF were heated at reflux at 90° C. for about 8 hours. To this reaction product 5.2 g of 2-hydroxyethyl methacrylate in 80 ml THF was added and heated to 50° C. for about 8 hours. The product was worked up in cool water to isolate 8 g of white powdered photosensitive oligomeric product (Component E) having both photosensitive

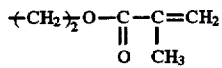

and carboxylic acid end groups present in the oligomer.

This photosensitive oligomer Component E can be employed with any suitable crosslinkable copolymeric oligomer, such as Component B, to provide a photosensitive film on a wafer in a manner similar to that described in Examples 1 and 2.

Example 4: Photoimageable Crosslinkable Aromatic-Aliphatic Oligomers

Another suitable photosensitive oligomer (Component F) is prepared in a reaction flask equipped with a reflux condenser by dissolving 2.65 g of 1,3,5-benzene tricarbonyl trichloride, 2.7 g butanediol and 6.1 g terephthaloyl chloride in 80 ml THF and heating the solution at 80° C. reflux for about 8 hours. To the reaction mixture product 2.6 g of 2-hydroxyethyl methacrylate in 40 ml THF was added and heated to 50° C. for about 6 hours. The product was worked up in cool water to isolate 6 g white powdered photosensitive oligomeric product (Component F) having both photosensitive

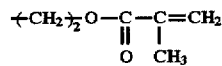

and carboxylic acid end groups in the oligomer.

This photosensitive oligomer Component F can also be employed with a suitable crosslinkable copolymeric oligomer, such as Component B, to provide a crosslinkable photosensitive film on a wafer in a manner similar to that described in Examples 1 and 2.

Example 5: Photoimageable Crosslinkable Aliphatic Oligomer

In a 100 ml flask equipped with an $N_2$ gas inlet, distillation head and thermometer, 6.8 g pentaerythritol and 29.2 g adipic acid were heated to 180° C. for about 1½ hour and then cooled to produce 25 g of reaction product. In a reaction flask equipped with a reflux condenser the 25 g of reaction product and 15 ml thionyl chloride were was. refluxed at 80° C. for about 8 hours followed by vacuum evaporation at about 40° C. to produce 25 g white sticky powdered reaction product to which was added 6 g 2-hydroxy-ethyl methacrylate in 80 ml THF and heated at 50° C. for 6 hours followed by cooling and working up in 50 to 60x water and vacuum filtration to produce 17 g of photoimageable crosslinkable product (Component G) having photosensitive

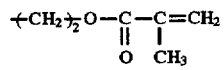

end groups present in the oligomer.

This photosensitive oligomer Component G can be employed with acetate-modified novolac resin (Component D) to provide a crosslinkable film on a wafer in a manner similar to that described in Examples 1 and 2.

After being photolithographically processed, as described in the foregoing Examples, the crosslinkable patterned films of the two crosslinkable oligomers on the wafer surface in each Example can be heated to regenerate the carboxylic acid end group which then can be cured to a crosslinked copolyester by foaming the oligomeric film by heating the film to a temperature of about 200° to 300° C. for about 1 hour in a nitrogen atmosphere. The heating causes degradation of the crosslinked photoimaged structure to form carboxylic acid followed by curing of the film by a crosslinking of the two oligomers in the film by forming crosslinked ester bonds with a concurrent release of acetic acid causing foaming of the cured film. By controlling the heating and thus the curing of the films, the reduction in the density of the film can be controlled and thereby control of the dielectric constant. The products of degradation of the photoimaged structure will also generate volatiles which can contribute to the foaming at a lower temperature. For example, when the patterned films of Example 1 are cured at 280° C. for about 1 hour, the films foam and their density is reduced by about 30%, i.e. to a density of about 70% of its original density. Concurrently, the dielectric constant of said film was reduced to about 2.3 at 25° C. and 1 MHz from a dielectric constant of 4.75 for the uncured film.

Additionally, the cured or crosslinked copolyester films satisfactorily retained their initial dimensions, namely those of the photoimaged patterns with only a modest thickness loss in the vertical direction. The adhesion of the patterned crosslinked polyester film layer on the wafer substrates remains good. The cured films passed the so-called adhesive tape test in which a strip of adhesive tape is stuck on and pulled off the film. The cured film layer can be cut with razor blades without causing cracking at the edges of the film layers and attempts to scratch the film layers with hard pencils were unsuccessful.

Moreover, the crosslinked, patterned photosensitive polyester film layers are stable for several hours at 400° C. in nitrogen and even brief thermal exposures of up to 450° C. do not lead to any adverse effects on the quality of the relief patterns.

The crosslinked, photosensitive, dielectric insulative copolyester films of this invention can be put onto various liquid crystal polyester chip substrates to produce power distribution lines, ground lines, redistribution circuitry and the like and these various laminates can then be stacked upon each other as a multiple layered package and bonded under heat and pressure, e.g. at 275° C., $13.7 \times 10^6$ Pa, to develop good adhesive bonds at the interface of the crosslinked, photosensitive copolyester films with the liquid crystal polyester substrates. As examples of liquid crystalline polyesters useful as substrates, there may be mentioned Xydar liquid crystalline polyester from Amoco Chemical Corp. and Vectra liquid crystalline polyester available from Hoechst-Celanese. However, other liquid crystalline polyesters suitable for use as substrates will be apparent to those skilled in the art. The liquid crystalline polyesters are particularly advantageous as substrates. Among the advantages are controlled coefficient of thermal expansion, thermal stability, chemical resistance, moisture resistance, and exceptional inherent stiffness. All of these properties improve the reliability of the MCM-L. Good bonds are obtained while retaining dimensional and thermal stability of the patterned films. Thus, these crosslinkable films are especially suitable for MCM-L applications and other package applications, particularly for high speed and high density multichip module laminate packages which permit greatly improved signal speed transmissions and reduced cross-talk.

With the foregoing description of the invention, those skilled in the art will appreciate that modifications may be made to the invention without departing from the true spirit thereof. Therefore, it is not intended that the scope of the invention be limited to the specific embodiments illustrated and described.

We claim:

1. A mixture for forming a film of a photosensitive, dielectric insulating, crosslinkale copolyeser, said mixture comprising:

(a) at least one oligomer having functional carboxylic acid end groups capped with methacryl groups, and
   (b) at least one oligomer having functional acyloxy end groups, in a film-forming solvent for said oligomers, and wherein one of the oligomers has more than two of said functional end groups present in the oligomer for functioning to form said copolyester.

2. A mixture for forming a film of a photosensitive, dielectric insulating, crosslinkable copolyester, said mixture comprising:

(a) at least one oligomer having functional

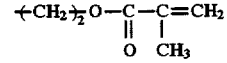

end groups, and
   (b) at least one oligomer having functional $C_3CO_2$— end groups, and one of the oligomers has more than two of said functional end groups present in the oligomer for functioning to form said copolyester.

3. A mixture according to claim 2 wherein the monomers from which the oligomers have been made are selected from the group consisting of 4-hydroxybenzoic acid, 2-hydroxy-6-napthoic acid, hydroquinone, isophthalic acid, terephthalic acid, 4,4'-biphenol, trimesic acid, trimellitic acid, adipic acid, ethylene glycol, hydroquinone diacetate, 4-acetoxy-benzoic acid, 2-acetoxy-6-naphthoic acid, 4,4'-diacetoxybiphenol and 2-hydroxyethyl methacrylate.

4. A mixture according to claim 3 wherein the monomers from which the oligomer has been made are selected from the group consisting of trimesic acid, hydroquinone diacetate and 4-acetoxybenzoic acid, isophthalic acid and 2-hydroxy-ethyl methacrylate.

5. A mixture according to claim 4 wherein the oligomers have a molecular weight in the range of from about 700 to about 850.

6. A mixture according to claim 1 wherein the oligomer having the acyloxy end groups comprises a partially to completely acetylated phenol-formaldehyde resin.

* * * * *